US005608341A

United States Patent [19]
Andersson

[11] Patent Number: 5,608,341
[45] Date of Patent: Mar. 4, 1997

[54] ELECTRICAL CIRCUIT FOR SETTING INTERNAL CHIP FUNCTIONS WITHOUT DEDICATED CONFIGURATION PINS

[75] Inventor: Ralph E. Andersson, Grass Valley, Calif.

[73] Assignee: Level One Communications, Inc., Sacramento, Calif.

[21] Appl. No.: 437,621

[22] Filed: May 9, 1995

[51] Int. Cl.$^6$ ............................................. H03K 19/0175
[52] U.S. Cl. ................................................. 326/38; 326/40
[58] Field of Search ........................................... 326/38–40

[56] References Cited

U.S. PATENT DOCUMENTS

| | | |
|---|---|---|
| 4,539,531 | 9/1985 | Thomas et al. . |
| 4,560,985 | 12/1985 | Strecker et al. . |
| 4,644,565 | 2/1987 | Seo et al. . |
| 4,833,422 | 5/1989 | Atwell . |
| 4,902,917 | 2/1990 | Simpson .................................. 326/38 |
| 4,907,225 | 3/1990 | Gulick et al. . |
| 5,051,622 | 9/1991 | Pleva ........................................ 326/38 |
| 5,113,093 | 5/1992 | Tashiro et al. ...................... 326/38 X |
| 5,123,014 | 6/1992 | Federkins et al. . |
| 5,136,582 | 8/1992 | Firoozmand . |
| 5,210,749 | 5/1993 | Firoozmand . |
| 5,237,218 | 8/1993 | Josephson et al. ........................ 326/38 |

FOREIGN PATENT DOCUMENTS

404017414A  1/1992  Japan ........................................ 326/38

*Primary Examiner*—David R. Hudspeth
*Attorney, Agent, or Firm*—Merchant, Gould, Smith, Edell, Welter & Schmidt, P.A.

[57] ABSTRACT

A circuit for selecting different applications based upon the manner in which external elements are attached. The selection of the applications is controlled based on the potential detected at a pin immediately following reset. The voltage at a node of the application sense pin is compared with a reference voltage. The pin used to sense the application is used as a sense immediately after reset has occurred. After this it can function as either an output or an input. A flip-flop is connected such that the output of the application sense pin and the condition of reset is directed appropriately to the flip-flop. When the condition of not-in-reset is sensed, the flip-flop latches to a first condition or to a second condition based on the potential at the application sense pin. A binary select allows $2^n$ different applications to be selected where n is the number of pins used to select the application. When a first binary code is sensed, a first application is implemented. When a second binary code is existent, a second application is implemented. The application sense may be used to select an LED display scheme or another application function.

20 Claims, 8 Drawing Sheets

ELECTRICAL CIRCUIT FOR SETTING INTERNAL CHIP FUNCTIONS WITHOUT DEDICATED CONFIGURATION PINS

BACKGROUND OF THE INVENTION

1. Field of the Invention

This invention relates to a circuit for setting internal chip functions, and more particularly, to a circuit which can determine the mode of operation without dedicated configuration pins.

2. Description of Related Art

This circuit allows multiple configurations of an integrated circuit's operation with a minimum of external components. In the marketing of highly-integrated, application-specific integrated circuits, it is becoming increasingly difficult to target the needs of all customers. To successfully sell a product in today's competitive marketplace, a chip manufacturer must create a distinct "feel" to their product through its form and function.

One way of creating a distinct "feel" to a chip is to design in flexibility. An integrated circuit manufacturer can attempt to anticipate all of the demands of its customers by designing multiple modes of operation into their chip. These modes are usually selected through configuration pins which are dedicated to mode selection. Thus, some pins may be used for mode selection during normal operation of the chip. For highly integrated designs, the pins of a device are usually all used; there are very few which are unconnected. Pins are used as functional inputs and outputs during normal operations. Further, since there are only a limited number of pins on a given package, they come at a premium. It is sometimes hard to give up a pin for defining configurations. Hence it is desirable to be able to configure a device's operation without having to sacrifice a pin which could otherwise be used as a functional input or output.

In some chips, LEDs are used to indicate the status of the operational conditions. Accordingly, a mode selection pin may be configured to change the truth table of the LEDs, i.e., how they blink to indicate the various operational conditions. A configuration pin can allow the user to select an alternate display scheme by pulling this pin high or low. Then, the appropriate changes are made to the LED function. In this manner with two such mode selection pins, up to four distinct LED blink patterns can be selected.

A single LED can display three different states: on, off or blinking. Thus, a dual LED can correspondingly display a large amount of data using only a single pin of an integrated circuit (IC) as described in application Ser. No. 08/271,111, filed Jul. 6, 1994, herein incorporated by reference. Nevertheless, trying to visually interpret all the information present is difficult as it is possible to encode up to five states with a dual LED. Each user of the IC might also want to distinguish their product by changing the manner in which data is displayed to the user.

It is accordingly desirable to have an arrangement where multiple LED truth table schemes can be used with the integrated circuit device without reconfiguring an IC device or providing unique devices for the different situations.

It can be seen then that there is a need for multiple blink schemes designed into an IC.

It can be seen then that there is a need for a mode selection design which allows the user of the chip to differentiate his product from his competition and allow the IC manufacturer to use the pins available to him in an efficient manner.

There is accordingly a need to provide a system for operating with a number of selectable modes of operation and yet be efficient from a logic and circuitry perspective.

SUMMARY OF THE INVENTION

To overcome the limitations in the prior art described above, and to overcome other limitations that will become apparent upon reading and understanding the present specification, the present invention discloses a system wherein multiple configurations of an integrated circuit's operation are controlled without dedicated configuration pins.

Means is provided for sensing an application by means of a potential detected at a pin immediately following reset thereby to provide a signal for determining which application is desired by the user.

The means for sensing the potential is digital means. The digital means is a means for comparing a voltage at a node of a pin with a threshold voltage. Thus, the pin used to sense the display application is used as a sense immediately after reset has occurred. After this it can function as an output or input depending on how it is configured.

A binary application select detects a logic 0 if the pin is left floating or is pulled low with a resistor. It detects a logic 1 if it is pulled high with a resistor. The sense threshold is such that all applications at the pin following reset, namely input or output with connected components, will only detect a logic 1 when the pin is pulled high by a pull-up resistor.

A flip-flop is connected such that the output of the application sense pin and the condition of reset is directed appropriately to the flip-flop. When the condition of not-in-reset is sensed, the flip-flop latches to a first condition representative of pull-up present at the sense pin or to a second condition when the sense voltage indicates anything other than a pull-up resistor.

The output latched application is directed to a responsive circuit operable in a first condition when a logic 0 is detected, and a second condition when a logic 1 is detected.

When multiple application sense pins are used, binary select allows $2^n$ different applications to be selected where n is the number of pins used to select the application. When a first binary code is sensed, a first application is implemented. When a second binary code is existent, a second application is implemented and so on.

Preferably, the driver, sensor and responsive circuit are formed as an integrated circuit device.

The invention is directed to the circuit and method for operating with a single or pair of display elements. This method of sensing an application, however, could be used in any number of ways other than selecting an LED display scheme.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

Figure 1:
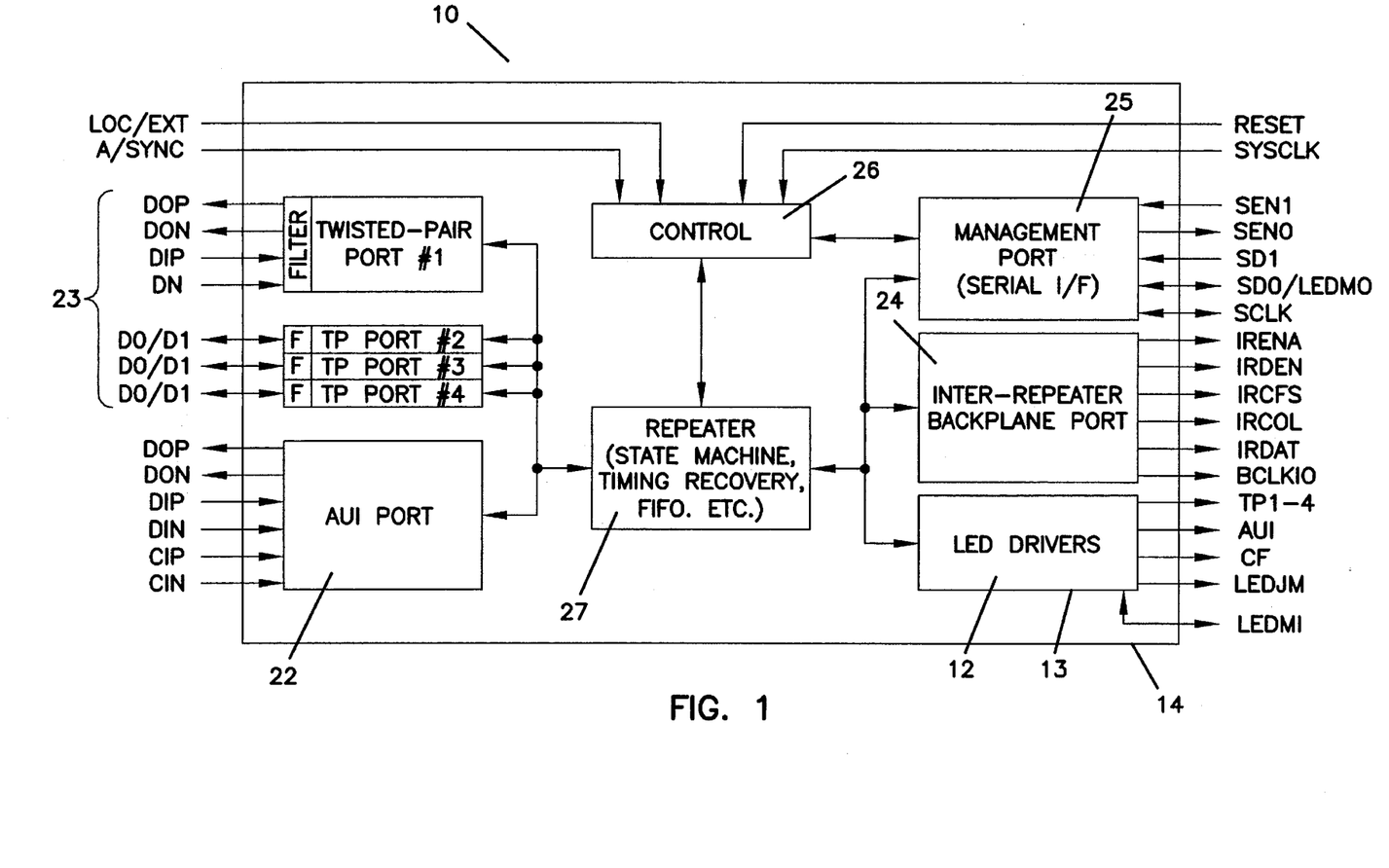
FIG. 1 is a block schematic of an integrated circuit repeater device in accordance with the invention.

FIG. 1 illustrates an integrated circuit chip 10 which may incorporate application sense functions in accordance with the invention. In the preferred embodiment, the chip provides all the active circuitry required for a repeater function in a single CMOS device. It includes an attachment unit interface (AUI) 22 and four 10-base T receivers 23. The AUI port allows for connection of an external transceiver or a drop cable. An alternative application allows the AUI to operate as a MAU allowing direct connection to a DTE port. The transceivers 23 are self-contained and require no external filters. There is an inter-repeater backplane interface 24 for allowing a multitude of 10-base T ports (≧128) to be cascaded together. Additionally, there is a serial port 25 for providing information for network management. The LED drivers 12 are provided as an integrated unit in the LED driver section 13. There is a control portion 26 provided for the chip and a repeater 27, timing recovery and FIFO of the chip.

For application sense functions according to the invention, an internal weak pull-down will sink current of approximately 40 uA on an application sense pin during the portion of time when a reset is being implemented on the chip. If the application sense pin functions as an output during non-sense periods, the output driver is tristated (disabled) during the portion of time when the external configuration is being sensed. If used as an input, no changes are made to the internal input function during the portion of time when the external configuration is being sensed. Thus, an application sense pin may be used to sense whether a primary application or a secondary/alternate application is desired. Further, the application sense pin may be used to change the application for a pin from an unassociated function to a function selected by external components.

Figure 2:
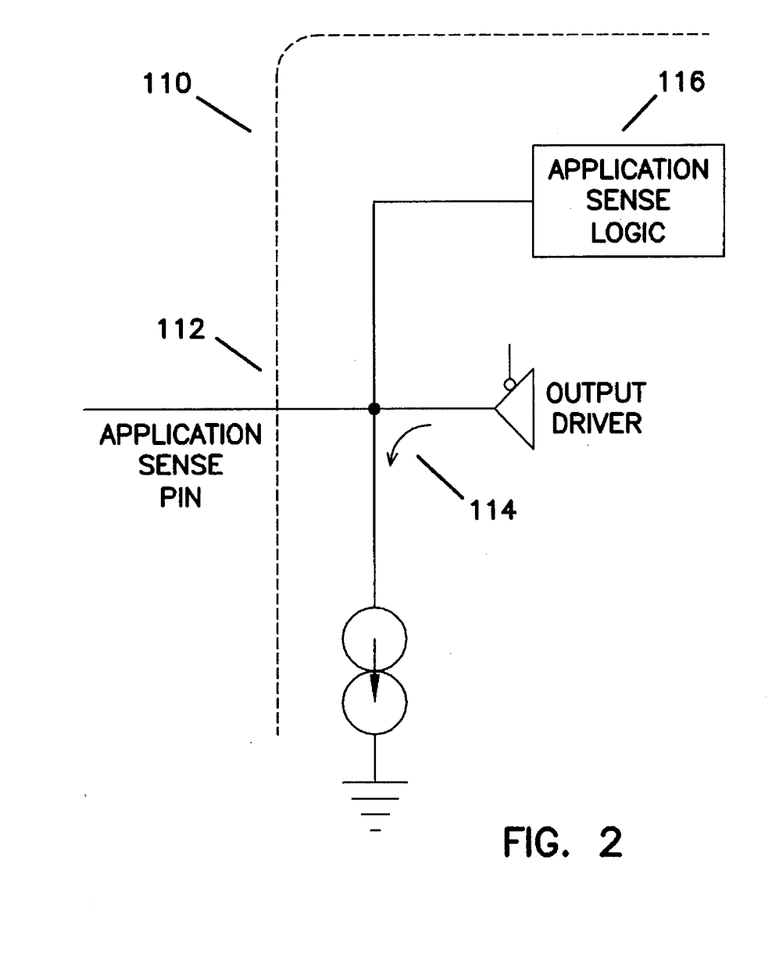
FIG. 2 is a schematic illustrating a circuit exemplifying the case of a primary application where the application sense pin is normally used as an output.

FIG. 2 illustrates a circuit 110 exemplifying the case where a primary application is desired and an application sense pin 112 is normally used as an output. The application sense pin 112, regardless of whether left unconnected or attached to the input of external logic, will detect a low logic level.

When the output pin 112 is left unconnected, the internal pull-down 114 is sufficient to result in a low logic level during the application sense period. The pull-down is enabled during reset and the output is disabled. The pull-down size is sufficient to pull the application sense pin down to 0 volts and a logic 0 is sensed by the application select logic 116. The operation of the application select logic 116 is explained in greater detail with reference to FIG. 8.

When connected to the input of external logic, a logic high level may be imposed upon the application sense/output pin 112 due to internal biasing of the external logic (if TTL). During reset, the pull-down is enabled and the output is disabled. If the external logic is TTL, the internal biasing of the application select causes the application sense pin to go to a voltage level of 1.4 volts (i.e., TTL logic high). If the external logic is CMOS, the pin of the device goes to zero volts. In any event, a logic 0 is sensed by application select logic 116.

The threshold level of the application sense circuit 116 is such that voltages below 0.8 of the supply voltage are detected as a low logic level.

Figure 3:
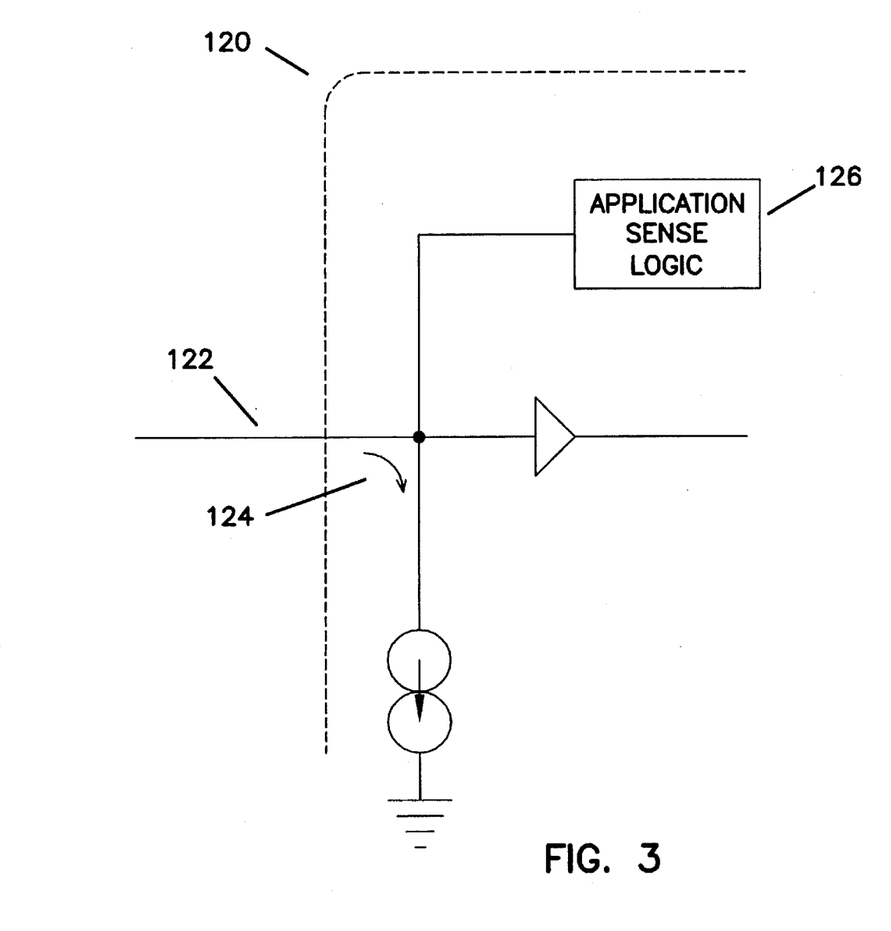
FIG. 3 is a schematic of a circuit exemplifying the case of a primary application where the application sense pin is normally used as an input during non-application sense periods.

FIG. 3 illustrates a circuit 120 exemplifying the case where a primary application is desired and the application sense pin 122 is normally used as an input during non-application sense periods. The external logic (not shown) driving this pin is constrained to be held low or tristated during reset. This allows the internal pull-down 124 to pull this pin 122 to the low logic level which will again be detected at the application sense pin 122 by the application sense logic 126.

When the secondary or alternate application is desired, an external pull-up resistor may be added to the application sense pin regardless of whether its normal function is input or output. Alternatively, external logic may drive the input to a logic high.

Figure 4:
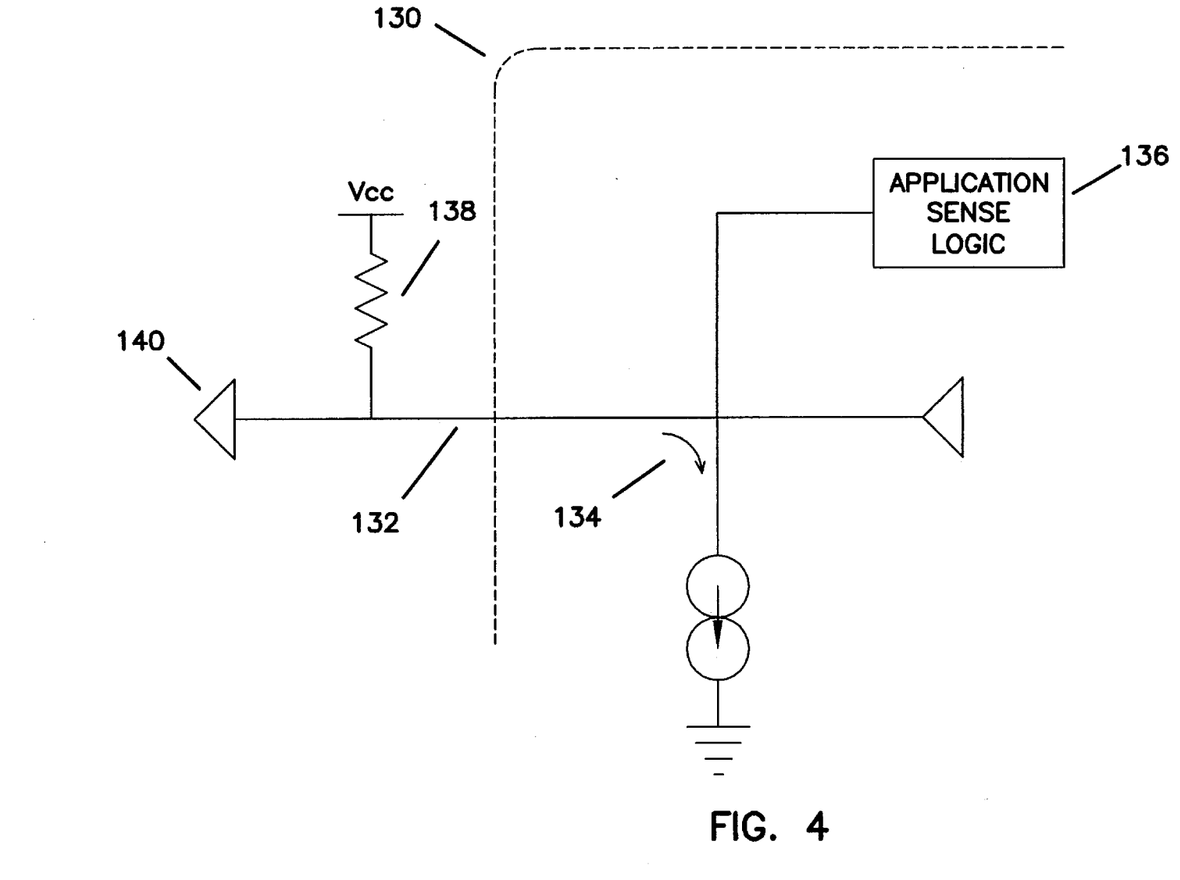
FIG. 4 is a schematic of a circuit exemplifying the case of an alternate application where the application sense pin is being used as an output which is connected to an external pull-up.

FIG. 4 illustrates a circuit 130 exemplifying the case where an alternate application is desired and the application sense pin 132 is being used as an output which is connected to an external pull-up 138. During reset, a logic high will be detected at the application sense pin 132 by the application sense logic 136 due to the fact the application sense pin 132 is connected to the pull-up. The effects of the input of external logic 140 and the internal pull-down must be considered. The voltage at the application sense pin 132 is equal to the supply voltage minus the voltage across the pull-up resistor 138. The voltage across the pull-up resistor 138 is equal to the resistor value times the sum of the internal pull-down 134 (i.e., approximately 40 uA) and the current drawn for input high logic by the logic device (Iinh). The value of the pull-up resistor 138 is chosen so that the voltage across the pull-up resistor is less than or equal to 0.2 $V_{cc}$. If the voltage across the pull-up resistor is less than or equal to 0.2 $V_{cc}$, a logic 1 is detected. Otherwise a logic 0 is detected.

Figure 5A:
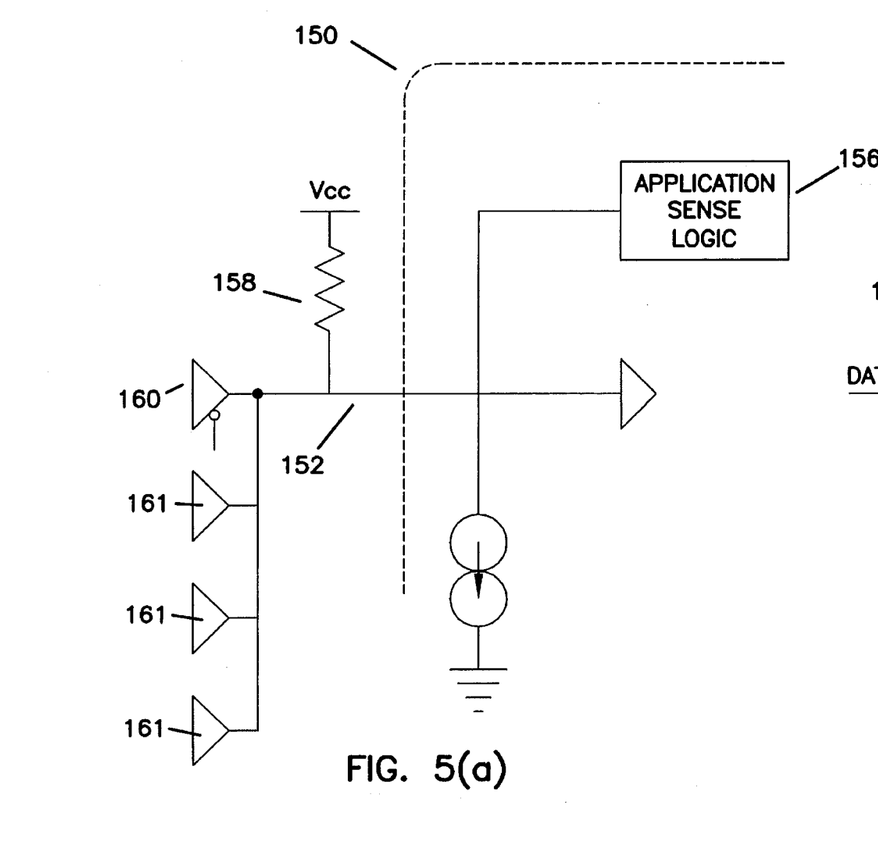
FIGS. 5(a)–5(b) are schematics of circuits connected to the application sense pin to adjust the potential of the pin to change from an unassociated function to a selected application.
Figure 5B:
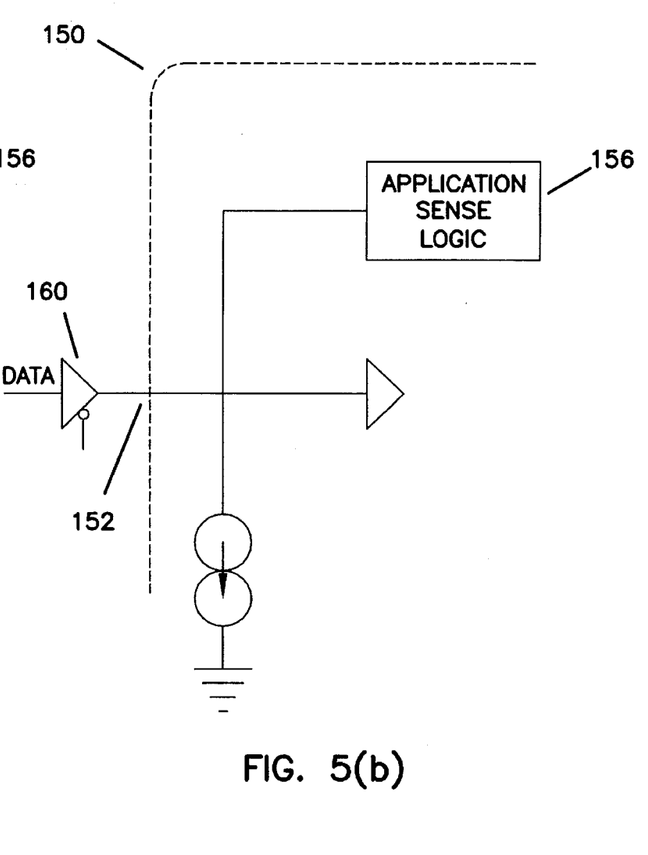

FIGS. 5(a) and 5(b) illustrate a circuit 150 exemplifying the case where the application sense pin 152 is being used as an input, but where the alternate application is desired. In this situation, the constraint is made such that the driving logic must be tristated during reset using a pull-up resistor to achieve logic high. When the primary application is desired the external device is tristated with no pull-up resistor.

Thus, if a pull-up 158 is tied to the application sense pin 152, the value of the pull-up resistor 158 must be chosen so that the voltage across the pull-up resistor 158 is less than or equal to 0.2 $V_{cc}$ as discussed with reference to FIG. 4. If the voltage across the pull-up resistor is less than or equal to 0.2 $V_{cc}$, a logic 1 is detected. Otherwise a logic 0 is detected. Other logic 161, which may or may not be connected to the application select pin, will have no affect on the application select as long as device 160 in conjunction with or without pull up 158 is sufficient to pull the application sense pin 152 to 0.8 $V_{cc}$.

FIG. 5(b) illustrates the condition where a pull-up resistor is not used. In this condition, the application select pin must be driven to a high logic level by the external logic when the reset is active.

In both cases, the sensed application is latched in on the falling edge of an active high reset. The reset change, in addition to latching in the application, releases the internal pull-down and the pin, if used as an output, is released from tristate and allowed to resume its normal function. If used as an input, no changes are made and the internal logic of the chip functions as defined.

The end result of these operations is a logical determination of the intended application of the device. This is provided to the appropriate blocks where the appropriate action is taken. This action is limitless in scope. The application select can be used to change handshaking implementation for communications with other logic, to redefine the outputs or inputs of specific pins, or to change timing. The entire functional definition of the chip can vary to suit the needs of the consumer allowing him to differentiate his product from his competition or to accomplish a specific need. The end result is that integrated circuit manufacturers are allowed to meet the needs of a broader customer base without having to sacrifice pins of a device for configuration purposes.

A PREFERRED EMBODIMENT OF THE INVENTION

Figure 6A:
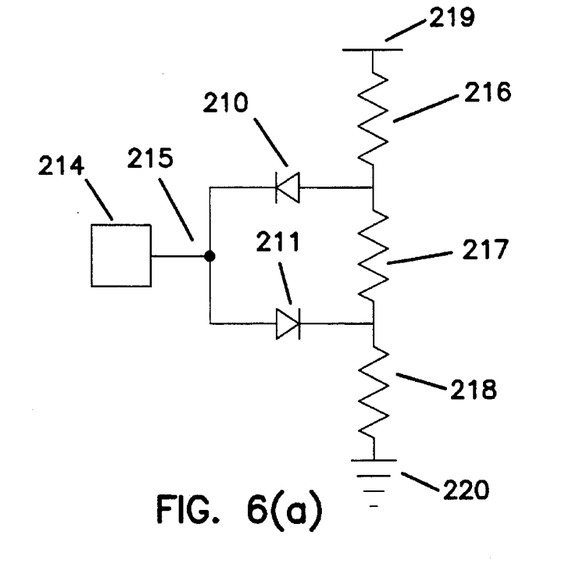
FIGS. 6(a)–6(c) are schematics illustrating LED configurations which may be sensed by the invention.
Figure 6B:
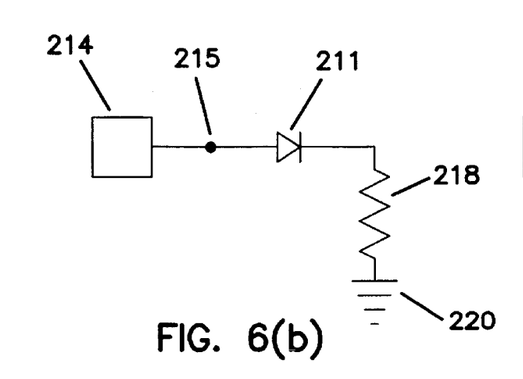
Figure 6C:
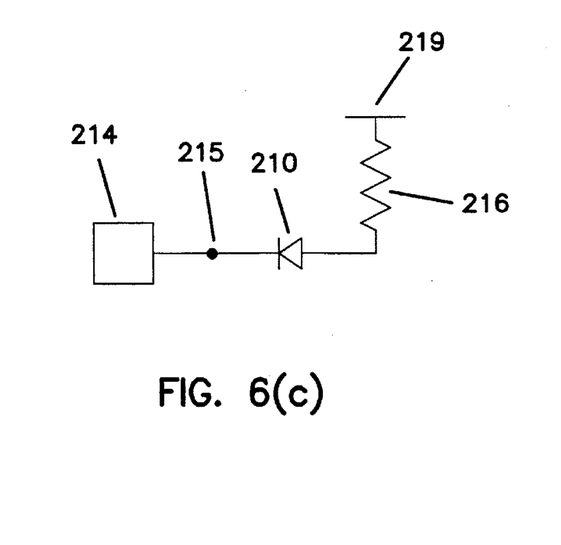

In a preferred embodiment of the invention, the application sense pin is used to select indication patterns for driving LEDs. FIGS. 6(a)–6(c) illustrate a circuit, which references ideas detailed in application Ser. No. 08/271,111, filed Jul. 6, 1994, incorporated by reference herein, for operating a pair of electrical display elements 210 and 211. The LED driver is connected through input/output terminal 215 to the display devices 210 and 211. As illustrated in FIGS. 6(a)–6(c), the display devices 210 and 211 are oppositely poled. The driver circuit for each of the pair of display elements 210 and 211 is a tri-state buffer.

In this preferred embodiment, the application sense function of the invention is used to select indication patterns for driving the LEDs. One of the pins used for application select for the LEDs functions as a serial output for data during non-application select periods. Also in the preferred embodiment, the LED display includes a dual, tri-state LED arrangement which is capable of indicating five states using a single output pin. FIG. 6(a) illustrates LED display elements 210 and 211 connected with two current-limiting resistors 216 and 218 and resistor 217 used for biasing. As indicated in FIG. 6(a), resistor 216 would have a resistance of 820 ohms, resistor 217 would have a resistance of 470 ohms and resistor 218 would have a resistance of 820 ohms. Resistor 216 is connected to a high-voltage level, Vcc, of 5 volts through line 219 and resistor 218 is connected to a low-voltage level, namely ground 220. In the tri-state mode, the voltage at terminal 215 is at some intermediate point.

FIG. 6(b) illustrates a single LED device 211 with a current limiting resistor 218 connected with ground 220. In FIG. 6(c) there is illustrated a single LED device 210 with a current limiting resistor 216 connected with high voltage level 219. FIGS. 6(a), 6(b) and 6(c) represent configurations which could be used with the primary LED application. FIG. 6(a) allows a user to visually interpret 5 distinct blink-patterns: LED 216 on/no blink, herein called state 1, LED 216 on/blink (state 2), LED 217 on/no blink (state 3), LED 217 on/blink (state 4) or both LEDs 216 and 217 on blinking out of phase (state 5).

Configuration 6(b) allows a user to visually interpret state 1 and 2 and FIG. 6(c) states 3 and 4. Nevertheless, it should be understood that the application sense function could be used to control internal chip configurations for selecting other modes of operation. Further, other LED configurations could be sensed by a system in accordance with the present invention.

Figure 7:
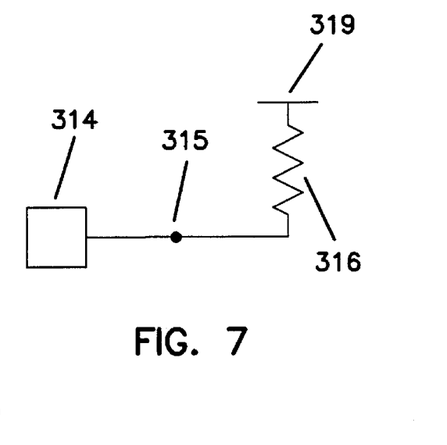
FIG. 7 is a pull-up resistor connected with an integrated circuit according to the invention.

In this manner one of the LED pins 215 can be used with a pull-up, during reset, to select another functional mode (FIG. 7). Note that the resistor will pull 215 high while 6(b) will be one $V_D$ lower ($V_{cc}$-1.5 v) than $V_{cc}$ due to internal pull-down. In this manner one of the LED pins is used to select the application of an unrelated function. This alternate application is only allowed to be chosen when the LEDs are operating in the non-primary application. That is why FIGS. 6(a), 6(b) and 6(c) must all be sensed as a logic 0.

FIG. 7 produces a voltage at node 315 which is about equal to that of the positive rail 319 when the LED driver is in the high impedance mode.

Figure 8:
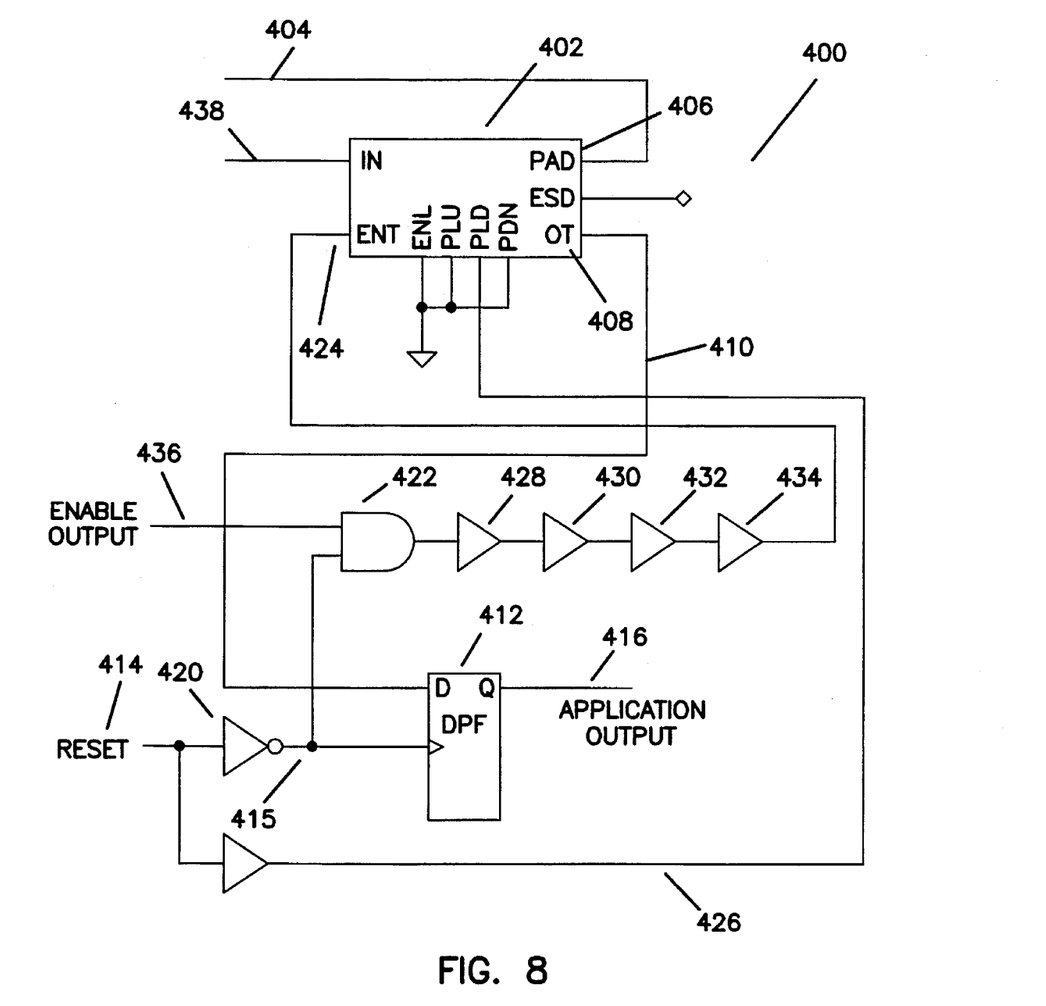
FIG. 8 is a block diagram schematic illustrating an I/O pad sensor, logic, and flip-flop latch of the logic application sense in accordance with the invention.

FIG. 8 illustrates the application sense logic circuit 400 for sensing the potential at an application sense pin or node. An I/O pad is connected to 404 and contained in 402 to compare the voltage at the in-out application sense pin 404, which is connected to the node 215. The node voltage is transmitted to the pad input 406 of the I/O pad cell 402. The output 408 from the I/O pad 402 is directed along line 410 to a flip-flop latch device 412. A reset 414 is transmitted along line 415. The output from the flip-flop latch 412 is directed to indicate the application along line 416. Thus, in the manner to be described more fully below, the signal along line 416 indicates an LED configuration selected by the user.

The operation of the circuit is determined in response to the sense signal transmitted from the I/O pad 402. The operation of the circuit, namely through the interaction of the flip-flop latch 412, as it responds to the sensing circuit 402 and the reset signal 414, is explained in relation to the timing diagrams of FIG. 9.

Figure 9:
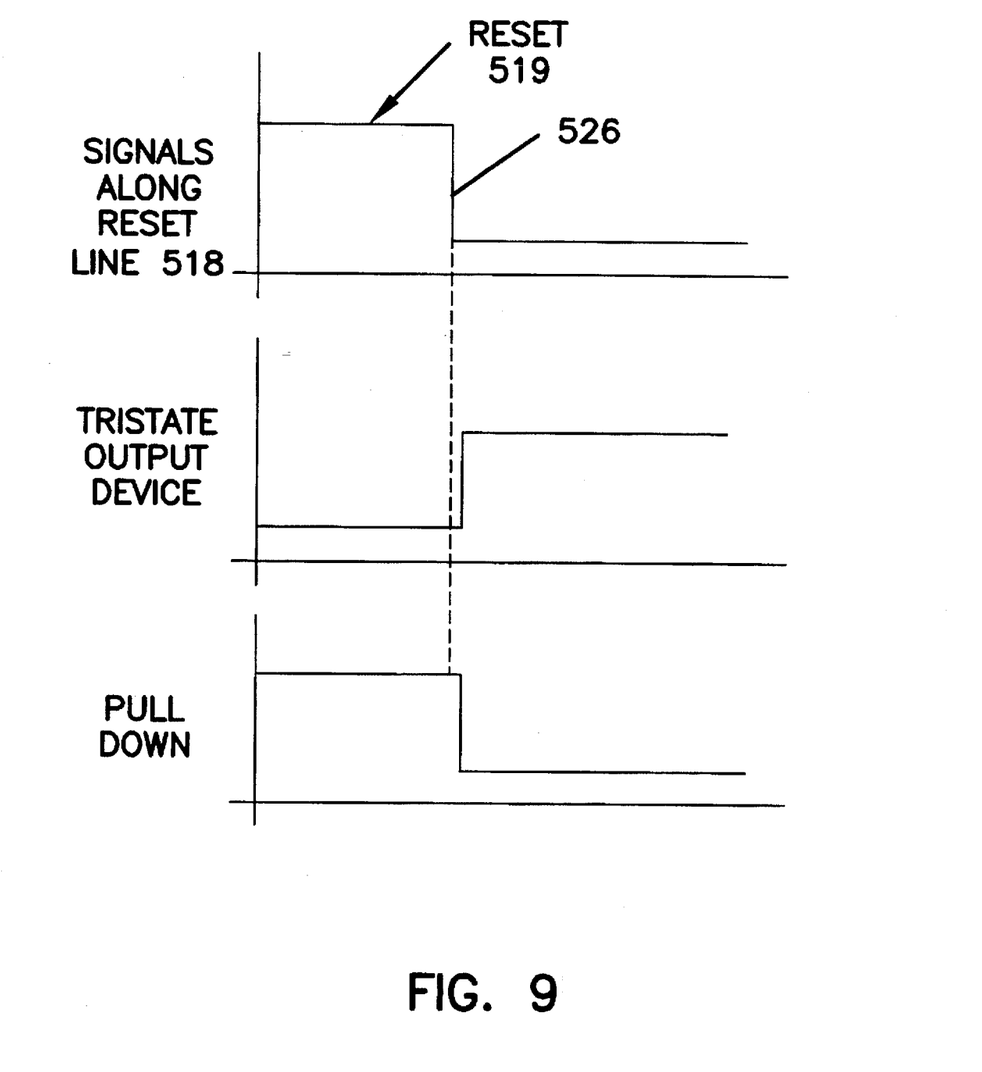
FIG. 9 is a timing diagram illustrating the operation of the flip-flop latch device of FIG. 8 in response to input signals.

In the topmost timing diagram of FIG. 9, there is illustrated a waveform 519 which represents the reset signal along line 518. Pin 404 is the application sense pin. Accordingly, the pad application sense pin 404 acts as either an input or an output pin during normal operation, but also functions as an application sense pin. The pad input 406 has a threshold of 0.8 $V_{cc}$. For voltages higher than 0.8 $V_{cc}$, a logic 1 appears at the output pin 408. When the reset 414 is high, the output of inverter 420 is low. Therefore, the output of the logic gate 422 is low, and the enable 424 is disabled. In addition, when reset 414 is high, the internal pull-down 426 is enabled. Thus, the output driver is placed in a high impedance mode and an internal pull-down current is applied to 404.

Latch 412 acts to latch in the application when the condition is not-in-reset and the LED driver is in the high-impedance mode as illustrated in FIG. 9.

Immediately following reset as indicated by line 526 the flip-flop 412 latches the appropriate logic to the output line 416 in the timing diagram. The latching of application occurs only after reset. After reset goes low the weak pull-down 426 is disabled as indicated in this bottom timing diagram of FIG. 9. On the falling edge of reset, application select is latched to output line 416 to indicate selection of the application. However, the I/O pad cell 402 is not free to resume its function until a number of gate delays later (422 and 428–434). When the application sense pin 404 functions as a data input pin, enable output 436 is tied low and input received at the application sense pin 404 is routed to the output pin 408 and from there to the rest of the chip. When the application sense pin's 404 other function is to act as an output, data from the data input pin 438 is passed out the application sense pin 408 and out of the chip via 406 and 404, e.g., 408 goes internal to chip.

The voltage present at node 215 of FIGS. 6(a)–6(c) during the time when LED driver is in the high impedance mode is determined by the circuit configuration.

For FIG. 6(a), the node voltage at 215 is determined by the sizing of the resistor chain 216, 217 and 218. For the values exemplified in this example, the voltage will be between about 3 volts and about 2 volts.

For FIG. 6(b), when LED driver is in high impedance mode, no current will flow through 211 and 218. Hence node 215 will be at 0 volt. For FIG. 6(c), when the LED driver is in high impedance mode the voltage at node 215 will be high except when the internal pull-down of device 402 is enabled at which time it is approximately 1.5 volts below the positive supply.

For FIG. 7, the reverse is true. The voltage at the LED node 215 is high. Thus, the voltage at 404 is at the same level, namely higher than the voltage threshold. The output from the pad 402 is one. That application is latched by the flip-flop 412 immediately after reset in the high-impedance mode.

SUMMARY

According to the invention, an integrated circuit may logically determine the intended application of the device. The application select can be used to change handshaking implementation for communications with other logic, to redefine the outputs or inputs of specific pins, or to change timing. The entire functional definition of the chip can vary to suit the needs of the consumer allowing him to differentiate his product from his competition or to accomplish a specific need. The end result is that we are allowed to meet the needs of a broader customer base.

However, many other forms of the invention exist, each differing from the others in matters of detail only. For instance, the sensor may be an analog sensor or a digital sensor. Further, instead of using an internal sensor as described, it is possible to define an application wherein the voltage at the node can be translated by a sensor off the chip 10. This can be done by comparing this node voltage to an on-board reference voltage.

In other situations instead of LED display elements, other suitable displays can be used.

A digital application of the invention is essentially the same as the analog. CMOS or bipolar TTL is used where state changes occur as the input crosses 1.4 V. Using a comparator the threshold is selected at which the change occurs. Digital cells are fairly sensitive to noise at their inputs if both inputs are at similar voltage. When both inputs are at the same voltage for a CMOS structure the output is in a region where small perturbations cause large variations in the output. The digital gate behaves as an analog amplifier in these circumstances. Analog comparators behave in the same manner with much larger gain. Thus, digital cells are much smaller. On a chip, a custom design of a digital cell can be chosen as to select desired threshold. On this design, the threshold was chosen to be higher than what is associated with standard logic. The distinction between the analog and digital system is related to size. Digital is superior in size and analog is better in gain. Both digital and analog can be used on chip; however, off chip analog would likely be better.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A device for selectively controlling internal functions of an integrated circuit comprising means for sensing an application indication by means of a potential detected at a pin, and circuit means for internally adjusting the potential of the pin in response to the detected potential, the sensing means being operative following a reset to provide a control signal for determining an application associated with the application indication selected by a user.

2. A device as claimed in claim 1 wherein the means for sensing is digital means having a high switching threshold.

3. A device as claimed in claim 1 wherein the sensing means comprises means for comparing the potential of the pin with a threshold voltage.

4. A device as claimed in claim 1 wherein the application is determined by a binary logic level at an application select pin, and having two applications select pins for selecting four applications.

5. A device as claimed in claim 4 wherein the two pins for sensing an application select pin are used, after sensing, for a respective function unrelated to sensing.

6. A device as claimed in claim 4 further comprising means for having the four applications being selectively one of three LED applications and a LED default application.

7. A device as claimed in claim 1 wherein the signal provided by the sensing means chooses between a primary application and a secondary/alternate application.

8. A device as claimed in claim 3 wherein the comparing means comprises flip-flop means and wherein the output from the sensing means is directed to an input of the flip-flop means, and wherein the flip-flop means is responsive to a condition of reset and not-in-reset.

9. A device as claimed in claim 8 wherein the flip-flop means comprises means responsive to a control signal such that when the flip-flop means is not-in-reset, the flip-flop means latches to a first condition representative of a first potential, and in a second condition the flip-flop means latches to a potential other than the first potential.

10. A device as claimed in claim 1 further comprising external resistor means for adjusting the potential of the pin.

11. A device as claimed in claim 3 further comprising, for at least one pin, at least one of a pull-up resistor for selecting a logic high or a pull-down resistor for selecting a logic low.

12. A device as claimed in claim 3 further comprising a floating pin or an input to an external logic device for selecting a logic low.

13. A device for selectively controlling internal functions of an integrated circuit comprising:

N application sense pins on an integrated circuit for selecting one of $N^2$ applications, the pins having an application sense function and a respective function unrelated to sensing;

circuit means, coupled to the N application sense pins, for internally adjusting a potential of the pins;

logic means, coupled to the N application sense pins, for comparing the potential at the pins with a reference voltage; and application select means, coupled to the logic means, for selecting one of the $N^2$ applications for the circuit in response to the comparison, the application being determined by a binary logic level at the N application select pins.

14. A device as claimed in claim 13 wherein the application select means chooses between a primary application and a secondary/alternate application.

15. A device as claimed in claim 13 further comprising, for at least one pin, at least one of a pull-up resistor for selecting a logic high or a pull-down resistor for selecting a logic low.

16. A device, as claimed in claim 13 further comprising a floating pin or an input to an external logic device for selecting a logic low.

17. A device as claimed in claim 13 wherein the application select means further comprises flip-flop means and wherein the potential at the N application sense pins is converted to a logic level by the logic means, the logic level being directed to an input of the flip-flop means, and wherein the flip-flop means is responsive to a condition of reset and not-in-reset.

18. A device as claimed in claim 17 wherein the flip-flop means comprises means responsive to a control signal such that when the flip-flop means is not-in-reset, the flip-flop means latches to a first condition representative of a first potential, and in a second condition the flip-flop means latches to a potential other than the first potential.

19. A device as claimed in claim 13 wherein the circuit means further comprises external resistor means for adjusting the potential of the N pins.

20. A device as claimed in claim 13 wherein the $N^2$ applications comprise one of three LED applications and a LED default application.

* * * * *